United States Patent
Lu et al.

(10) Patent No.: US 10,783,830 B1
(45) Date of Patent: Sep. 22, 2020

(54) TFT PIXEL THRESHOLD VOLTAGE COMPENSATION CIRCUIT WITH SHORT PROGRAMMING TIME

(71) Applicant: Sharp Kabushiki Kaisha, Osaka (JP)

(72) Inventors: Tong Lu, Oxford (GB); Michael James Brownlow, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/411,461

(22) Filed: May 14, 2019

(51) Int. Cl.
  *G09G 3/3258* (2016.01)
  *H01L 27/32* (2006.01)

(52) U.S. Cl.
  CPC ....... *G09G 3/3258* (2013.01); *H01L 27/3262* (2013.01); *G09G 2310/0264* (2013.01); *G09G 2330/021* (2013.01)

(58) Field of Classification Search
  CPC ..... G09G 3/3208; G09G 3/3225–3258; G09G 2300/043; G09G 2310/064; G09G 2320/043; G09G 2320/045
  See application file for complete search history.

(56) References Cited

U.S. PATENT DOCUMENTS

| | | | |
|---|---|---|---|
| 7,277,071 B2 | 10/2007 | Oh | |
| 7,414,599 B2 | 8/2008 | Chung et al. | |
| 8,284,136 B2 | 10/2012 | Kang et al. | |
| 9,455,311 B2 | 9/2016 | Shishido | |
| 9,773,449 B2 | 9/2017 | Lin et al. | |
| 10,062,321 B2 | 8/2018 | Na et al. | |
| 10,127,859 B2 | 11/2018 | Chang et al. | |
| 2016/0204165 A1* | 7/2016 | Yang | G09G 3/3225 345/174 |

\* cited by examiner

*Primary Examiner* — Laurence J Lee
(74) *Attorney, Agent, or Firm* — Renner, Otto, Boisselle & Sklar, LLP

(57) ABSTRACT

A pixel circuit has enhanced performance by minimizing noise effects from the data and reference voltage lines. To prevent data line noise from interfering with the drive transistor gate voltage during emission, a triple gate isolation is used between the data voltage line and the gate of the drive transistor by which three transistors are connected between the data voltage line and the gate of the drive transistor. To further improve the isolation, one of the middle nodes of the triple gate farthest from the data voltage line is connected to one floating node that is connectable to a reference voltage during the threshold compensation phase. A first capacitor is used for the threshold compensation, and a second capacitor is used to scale the data voltage during programming. The threshold compensation and data programming operations are thereby independent of each other to minimize programming time.

20 Claims, 8 Drawing Sheets

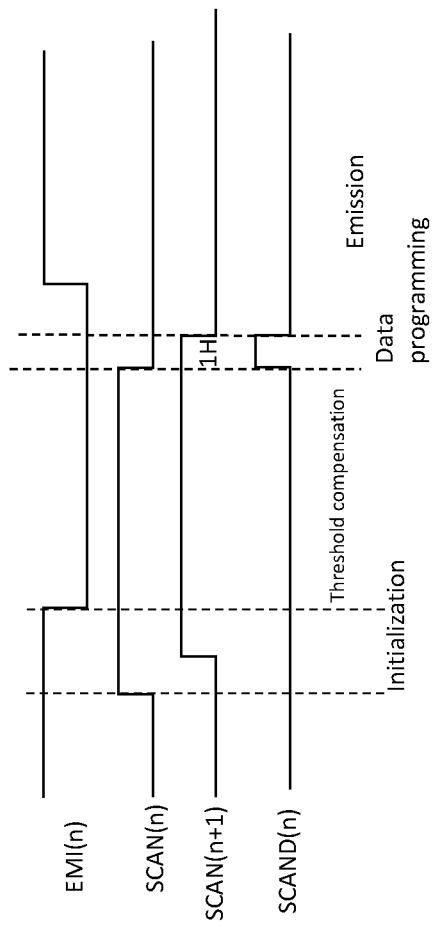

TFT PIXEL THRESHOLD VOLTAGE COMPENSATION CIRCUIT WITH SHORT PROGRAMMING TIME

TECHNICAL FIELD

The present invention relates to design and operation of electronic circuits for delivering electrical current to an element in a display device, such as for example to an organic light-emitting diode (OLED) in the pixel of an active matrix OLED (AMOLED) display device.

BACKGROUND ART

Organic light-emitting diodes (OLED) generate light by re-combination of electrons and holes, and emit light when a bias is applied between the anode and cathode such that an electrical current passes between them. The brightness of the light is related to the amount of the current. If there is no current, there will be no light emission, so OLED technology is a type of technology capable of absolute blacks and achieving almost "infinite" contrast ratio between pixels when used in display applications.

Several approaches are taught in the prior art for pixel thin film transistor (TFT) circuits to deliver current to an element of a display device, such as for example an organic light-emitting diode (OLED), through a p-type drive transistor. In one example, an input signal, such as a low "SCAN" signal, is employed to switch transistors in the circuit to permit a data voltage, VDAT, to be stored at a storage capacitor during a programming phase. When the SCAN signal is high and the switch transistors isolate the circuit from the data voltage, the VDAT voltage is retained by the capacitor, and this voltage is applied to a gate of a drive transistor. With the drive transistor having a threshold voltage $V_{TH}$, the amount of current to the OLED is related to the voltage on the gate of the drive transistor by:

$$I_{OLED} = \frac{\beta}{2}(V_{DAT} - V_{DD} - V_{TH})^2$$

Where $V_{DD}$ is a power supply connected to the source of the drive transistor.

TFT device characteristics, especially the TFT threshold voltage $V_{TH}$, may vary with time or among comparable devices, for example due to manufacturing processes or stress and aging of the TFT device over the course of operation. With the same VDAT voltage, therefore, the amount of current delivered by the drive TFT could vary by a significant amount due to such threshold voltage variations. Therefore, pixels in a display may not exhibit uniform brightness for a given VDAT value.

Conventionally, therefore, OLED pixel circuits have high tolerance ranges to variations in threshold voltage and/or carrier mobility of the drive transistor by employing circuits that compensate for mismatch in the properties of the drive transistors. For example, an approach is described in U.S. Pat. No. 7,414,599 (Chung et al., issued Aug. 19, 2008), which describes a circuit in which the drive TFT is configured to be a diode-connected device during a programming period, and a data voltage is applied to the source of the drive transistor.

The threshold compensation time is decided by the drive transistor's characteristics, which may require a long compensation time for high compensation accuracy. For the data programming time, the RC constant time required for charging the programming capacitor is determinative of the programming time. As is denoted in the art, the one horizontal (1H) time is the time that it takes for the data to be programmed for one row.

With such circuit configuration as in U.S. Pat. No. 7,414,599, the data is programmed at the same time as when the threshold voltage of the drive transistor is compensated. It is desirable, however, to have as short of a one horizontal time as possible to enhance the responsiveness and operation of the display device. This is because each row must be programmed independently, whereas other operations, such as for example drive transistor compensation, may be performed for multiple rows simultaneously. The responsiveness of the display device, therefore, tends to be dictated most by the one horizontal time for programming. When the data is programmed during the same operational phase that the drive transistor is compensated, the one horizontal time cannot be reduced further due to compensation accuracy requirements for the drive transistor, as the compensation requirements limit any time reductions for the programming phase.

Another approach is described in U.S. Pat. No. 7,277,071 (Choon-Vul Oh, issued Oct. 2, 2007). In such circuit, two capacitors are used, one for storing the programmed data voltage and the other one for storing the threshold voltage of the drive transistor. In this way, the one horizontal time is dictated by the data programming time only, but this scheme does not use the advantage of independent programming time to minimize the one horizontal time. The configuration uses the same scan signal in the consecutive rows for threshold voltage compensation and data programming. Hence, the one horizontal time is still dependent upon the threshold compensation time.

Another approach is described in U.S. Pat. No. 8,284,136 (Chul-Kyu Kang, issued Oct. 9, 2012). The data voltage is first programmed to one capacitor. During the threshold compensation phase, the data voltage is fixed at the gate of the drive transistor, and the source of the drive transistor is pull up to the data voltage minus the drive transistor threshold voltage. The threshold voltage is stored to a second capacitor and can be compensated independently from the data programming. The circuit operation necessarily employs an initialization phase, during which the source of the drive transistor is pulled down. In this case, the OLED is turned on, which means that during the initialization phase, there will be light emission. This light emission during the initialization phase degrades the true blackness of the OLED operation.

U.S. Pat. No. 9,455,311 (Hideaki Shishido, issued Sep. 27, 2016) describes a circuit operation with a longer threshold compensation time and a shorter data programming phase performed at the end of the threshold compensation phase. Hence, a shorter one horizontal time is achieved. A disadvantage of this operation, however, is that when data is programmed, the programming operation can disturb the compensated threshold voltage and compromise the accuracy of threshold compensation. U.S. Pat. No. 9,773,449 (Yung-Ming Lin, issued Sep. 26, 2017) describes a similar operation by which data is programmed after threshold voltage compensation. The data programming does not disturb the threshold compensation, but a disadvantage of this scheme is that the terminal of the capacitor for data programming is floating during the emission phase. The noise from the data line could couple to the programming capacitor, so the gate voltage of the drive transistor could be affected by this noise during the emission phase. Hence, the OLED current could be disturbed by the noise from the data line.

U.S. Ser. No. 10/062,321 (Ji-su Na, issued Aug. 28, 2018) describes a circuit operation applying a reference voltage to the gate of the drive transistor for threshold compensation and then applying data to the gate of the drive transistor for data programming. A short 1H time can be achieved, but such operation similarly experiences the detrimental effects of noise from the data line.

U.S. Ser. No. 10/127,859 (Sangwook Change, issued Nov. 13, 2018) describes a circuit operation similarly applying a reference voltage to the gate of the drive transistor for threshold compensation and then applying data to the gate of the drive transistor for data programming. A short 1H time can be achieved, but the described circuit configuration uses double gates for the data line and reference voltage line for isolation. Data noise isolation performance remains deficient, and thus such noise still can affect the output during the emission phase.

SUMMARY OF INVENTION

The present invention relates to pixel circuits that are capable of compensating the threshold voltage variations of the drive transistor with an ultra-short one horizontal time 1H of less than about 2 µs, which is shorter as compared to conventional configurations, with additionally removing the possible memory effects associated with the OLED device and drive transistor from the previous frame. In addition, the pixel circuit configurations described in the current application minimize noise from the data line and reference voltage line in a manner that is superior to conventional configurations.

Embodiments of the present application provide pixel circuits for high refresh rate requirements, such as for 120 Hz applications. For such applications, an ultra-short 1H time (<2 µs) is achieved via separation of threshold compensation of the drive transistor and data programming phases. The threshold compensation time is dictated by the drive transistor characteristics and is difficult to reduce further without degrading the compensation accuracy. By separating the threshold compensation and data programming phases, a longer time can be allocated to threshold compensation for compensation accuracy. As referenced above, the RC constant time required for charging the programming capacitor is determinative of the programming time, and such programming time can be reduced to ultra-short 1H times (<2 µs).

To prevent data line noise from interfering with the voltage at the drive transistor gate during emission, a triple gate isolation is used between the data voltage line and the gate of the drive transistor by which three transistors are connected between the data voltage input line and the gate of the drive transistor. To further improve the isolation, one of the middle nodes of the triple gate farthest from the data voltage input line is connected to one floating node that is connectable to a reference voltage during the threshold compensation phase. In this manner, use of the triple gate connection for the data voltage signal and the node where the data voltage and reference voltage paths connect enhance the reduction of noise, particularly from the data voltage line.

In addition, a two-capacitor structure is used. A first capacitor is used for the threshold compensation during compensation phase, and a second capacitor is used to scale the data voltage between the two capacitors during the programming phase. The threshold compensation and data programming operations are thereby independent of each other, and thus a short one horizontal time can be achieved with a short data programming phase. The scaled data voltage is added to the first capacitor, and the sum of the threshold voltage and the scaled data voltage is applied at the gate of the drive transistor for emission during the emission phase. The short one horizontal time improves the responsiveness of the OLED.

An aspect of the invention, therefore, is a pixel circuit for a display device operable in a compensation phase, a programming phase, and an emission phase, whereby the one horizontal time is minimized while maintaining accurate compensation of the threshold voltage of the drive transistor, and noise applied to the gate of drive transistor during the emission phase is substantially eliminated. In exemplary embodiments, the pixel circuit includes a drive transistor configured to control an amount of current to a light-emitting device during the emission phase depending upon a voltage applied to a gate of the drive transistor; a first capacitor having a first plate connected to the gate of the drive transistor and a second plate connected to a first terminal of the drive transistor, wherein the second plate also is connected to a first power supply during the emission phase; a light-emitting device that is connected at a first terminal to a second terminal of the drive transistor during the emission phase and at a second terminal to a second power supply; second group transistors connected between the gate of the drive transistor and a data voltage input line, wherein the second group transistors comprises three transistors to provide a triple gate connection between the data voltage input line and the gate of the drive transistor; and third group transistors connected between a reference voltage input line and a node located between adjacent transistors of the second group transistors.

The second group transistors may include a first transistor that is connected between the gate of the drive transistor and a node N1; a second transistor that is connected between the node N1 and a first terminal of a third transistor; and a second terminal of the third transistor connected to the data voltage input line. The third group transistors may include a fourth transistor that is connected between the reference voltage input line and a node N2; a fifth transistor that is connected between the node N1 and the node N2; and a sixth transistor that is connected between the second terminal of the drive transistor and the node N2. The pixel circuit further may include a second capacitor that is connected between the first power supply and the first terminal of the drive transistor, and during the programming phase the second capacitor distributes the data voltage between the first and second capacitors.

Another aspect of the invention is a method of operating a pixel circuit according to any of the embodiments, whereby the one horizontal time is minimized while maintaining accurate compensation of the threshold voltage of the drive transistor, and noise applied to the gate of drive transistor during the emission phase is substantially eliminated. In exemplary embodiments, the method of operating includes the steps of providing a pixel circuit according to any of the embodiments; performing a compensation phase to compensate a threshold voltage of the drive transistor comprising: diode connecting the drive transistor by connecting a gate and a second terminal of the drive transistor through a portion of the second and third group transistors; disconnecting the first terminal of the drive transistor from the first power supply; and applying a reference voltage from the reference voltage input line to the gate of the diode-connected drive transistor through a portion of the second and third group transistors; performing a data programming phase to program a data voltage from the data voltage input line at the first capacitor, comprising applying the data voltage through the second group transistors to the first plate of the first capacitor and to the gate of the drive transistor; and performing an emission phase during which light is emitted from the light-emitting device comprising: applying the first power supply to the second terminal of the storage capacitor and to the first terminal of the drive transistor; and applying the second power supply to the second terminal of the light-emitting device.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 8 is a drawing depicting a timing diagram associated with the operation of the circuit of FIG. 7.

DESCRIPTION OF EMBODIMENTS

Figure 1:
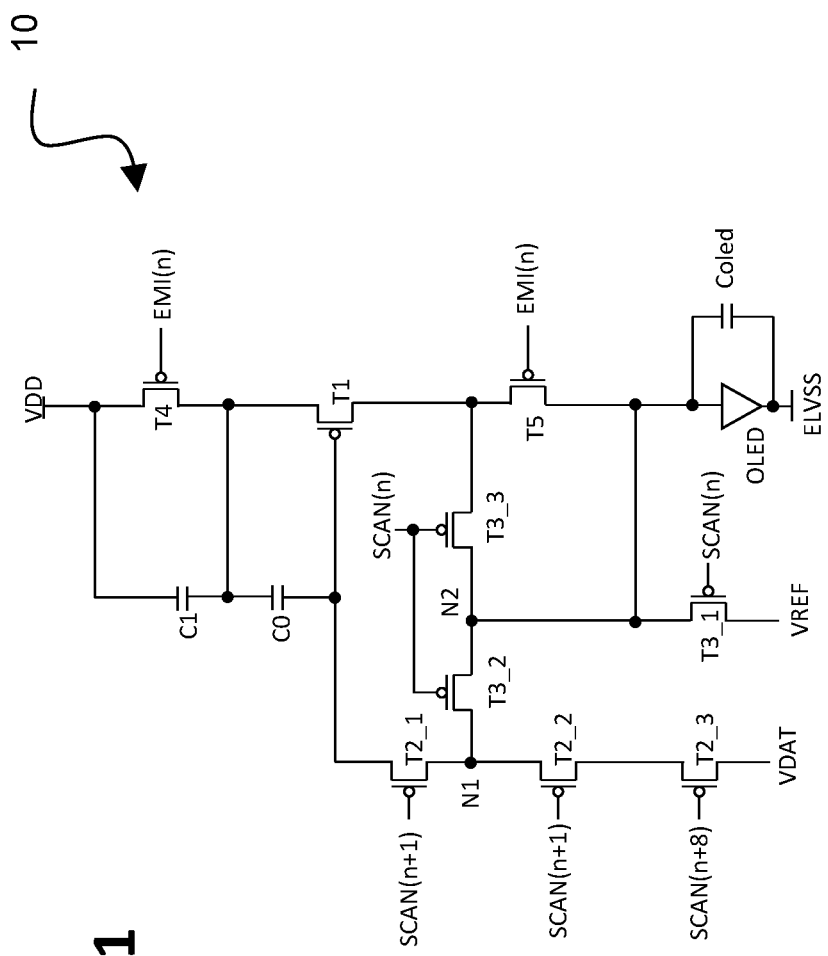
FIG. 1 is a drawing depicting a first circuit configuration in accordance with embodiments of the present invention.

Embodiments of the present invention will now be described with reference to the drawings, wherein like reference numerals are used to refer to like elements throughout. It will be understood that the figures are not necessarily to scale.

Figure 2:
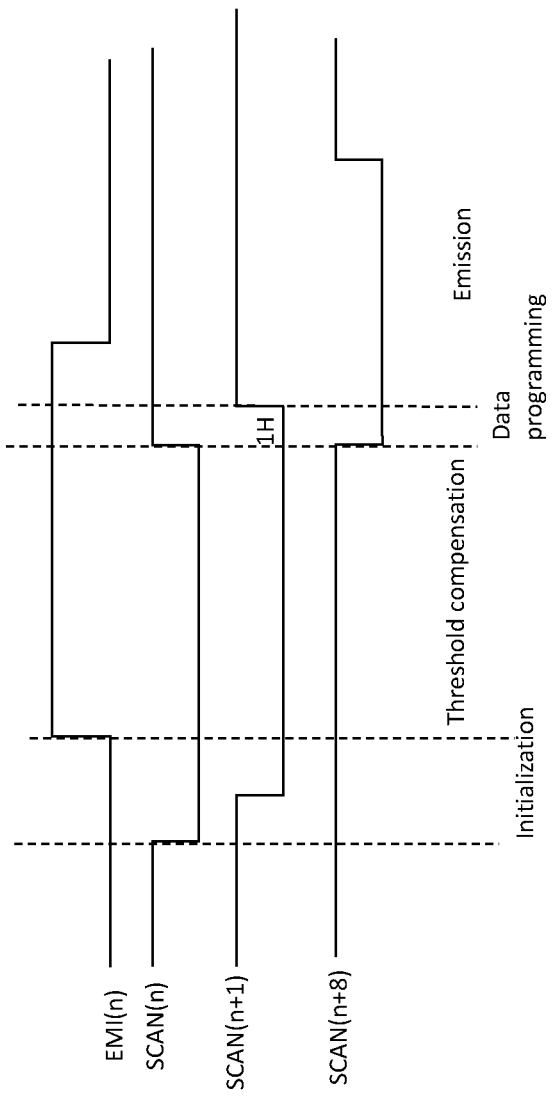
FIG. 2 is a drawing depicting a timing diagram associated with the operation of the circuit of FIG. 1.

FIG. 1 is a drawing depicting a first circuit configuration 10 in accordance with embodiments of the present invention, and FIG. 2 is a timing diagram associated with the operation of the circuit configuration 10 of FIG. 1. In this example, the circuit 10 is configured as a thin film transistor (TFT) circuit that includes multiple p-type transistors T1, T2_1, T2_2, T2_3, T3_1, T3_2, T3_3, T4, T5 and two capacitors C0 and C1. The circuit elements drive a light-emitting device, such as for example an OLED. The light-emitting device (OLED) has an associated internal capacitance, which is represented in the circuit diagram as $C_{oled}$. In addition, although the embodiments are described principally in connection with an OLED as the light-emitting device, comparable principles may be used with display technologies that employ other types of light-emitting devices, including for example micro LEDs and quantum dot LEDs.

More specifically, FIG. 1 depicts the TFT circuit 10 configured with multiple p-MOS or p-type TFTs. T1 is a drive transistor that is an analogue TFT, and T2-T5 are digital switch TFTs. As referenced above, C0 and C1 are capacitors, with C1 also being referred to as the programming capacitor and C0 also being referred to as the storage capacitor. $C_{oled}$ is the internal capacitance of the OLED device (i.e., $C_{oled}$ is not a separate component, but is inherent to the OLED). The OLED further is connected to a power supply ELVSS as is conventional.

The OLED and the TFT circuit 10, including the transistors, capacitors and connecting wires, may be fabricated using TFT fabrication processes conventional in the art. It will be appreciated that comparable fabrication processes may be employed to fabricate the TFT circuits according to any of the embodiments.

For example, the TFT circuit 10 (and subsequent embodiments) may be disposed on a substrate such as a glass, plastic, or metal substrate. Each TFT may comprise a gate electrode, a gate insulating layer, a semiconducting layer, a first electrode, and a second electrode. The semiconducting layer is disposed on the substrate. The gate insulating layer is disposed on the semiconducting layer, and the gate electrode may be disposed on the insulating layer. The first electrode and second electrode may be disposed on the insulating layer and connected to the semiconducting layer using vias. The first electrode and second electrode respectively may commonly be referred to as the "source electrode" and "drain electrode" of the TFT. The capacitors each may comprise a first electrode, an insulating layer and a second electrode, whereby the insulating layer forms an insulating barrier between the first and second electrodes. Wiring between components in the circuit, and wiring used to introduce signals to the circuit (e.g. SCAN, EMI, VDAT and VREF) may comprise metal lines or a doped semiconductor material. For example, metal lines may be disposed between the substrate and the gate electrode of a TFT, and connected to electrodes using vias. The semiconductor layer may be deposited by chemical vapour deposition, and metal layers may be deposited by a thermal evaporation technique.

The OLED device may be disposed over the TFT circuit. The OLED device may comprise a first electrode (e.g. anode of the OLED), which is connected to transistors T3_1 and T5 in this example, one or more layers for injecting or transporting charge (e.g. holes) to an emission layer, an emission layer, one or more layers for injecting or transporting electrical charge (e.g. electrons) to the emission layer, and a second electrode (e.g. cathode of the OLED), which is connected to power supply ELVSS in this example. The injection layers, transport layers and emission layer may be organic materials, the first and second electrodes may be metals, and all of these layers may be deposited by a thermal evaporation technique.

Referring to the TFT circuit 10 of FIG. 1 in combination with the timing diagram of FIG. 2, the TFT circuit 10 operates to perform in four phases: an initialization phase, a threshold compensation phase, a data programming phase, and an emission phase for light emission. The time period for performing the programming phase is referred to in the art as the "one horizontal time" or "1H" time as illustrated in the timing diagram and in subsequent the timing diagrams. A short 1H time is a requirement for displays with a large number of pixels in a column, as is necessary for high-resolution displays and for high refresh rates such as used for 120 Hz applications. As referenced above, a short one horizontal time is significant because each row must be programmed independently, whereas other operations, such as for example drive transistor threshold compensation, may be performed for multiple rows simultaneously. The responsiveness of the device, therefore, tends to be dictated most by the one horizontal time for programming.

Generally, this embodiment has comparable control signals EMI and SCAN for other rows of pixels in the overall or broader display device, thereby enabling fewer control signal wires in a display configuration as common control lines may be shared over different rows. For this example and in subsequent embodiments, display pixels are addressed by row and column. The current row is row n. The previous row is row n−1, and the second previous row is n−2. The next row is row n+1, and the row after that is row n+2, and so on for the various rows as they relate to the corresponding control signals identified in the figures. Accordingly, for example, SCAN(n) refers to the scan signal at row n and SCAN(n+1) refers to the scan signal at row n+1, and the like. EMI(n) refers to the emission signal at row n and EMI(n−1) refers to the emission signal at row n−1, and the like, and so on for the various control signals. In this manner, for the various embodiments the input signals correspond to the indicated rows.

The "T2" transistor group (i.e., transistors T2_1, T2_2, and T2_3), also referred to herein as the second group transistors, define a data signal pathway from a data voltage input line VDAT to the gate of the drive transistor T1. Because there are three transistors within the data signal pathway, such T2 transistor group is referred to as a triple gate connection between the data voltage input line and the gate of the drive transistor. The "T3" transistor group (i.e., transistors T3_1 and T3_2), also referred to herein as the third group transistors, define a reference signal pathway from a reference voltage line input VREF to a node N1 between the first and second transistors (T2_1 and T2_2) of the data signal pathway. The T3 transistor group further includes transistor T3_3 that connects the VREF line to the drain of the drive transistor, and a node N2 is defined between T3_2 and T3_3.

In this first embodiment, during the previous emission phase, the EMI(n) signal level has a low voltage value, so transistors T4 and T5 are on, and light emission is being driven by the input driving voltage VDD connected to the drive transistor T1, whereby the actual current applied to the OLED is determined by the voltage at the gate of the drive transistor. The SCAN signal levels for the applicable rows initially have a high voltage value so transistors T2_1, T2_2, T2_3, T3_1, T3_2 and T3_3 are all in an off state. Next, at the beginning of the initialization phase, the SCAN(n) signal level is changed from a high voltage value to a low voltage value, causing transistor T3_1, T3_2 and T3_3 to be turned on. As transistor T3_1 is turned on, the reference voltage, VREF, is applied at the anode of the OLED. The VREF voltage is set to lower than the threshold voltage of the OLED plus ELVSS, and thus the VREF voltage does not cause light emission when applied at anode of the OLED. As transistor T3_2 is turned on, the VREF voltage is applied to node N1 through the reference signal pathway through transistor T3_1 and T3_2. As transistor T3_3 is turned on, the VREF voltage also is applied to the drain of the drive transistor through T3_1 and T3_3. The drain of the drive transistor is also connected to the VREF through transistors T5 and T3_1.

Next during the initialization phase, the SCAN(n+1) signal level is changed from a high voltage value to a low voltage value, causing transistors T2_1 and T2_2 to be turned on. As transistor T2_1 is turned on, VREF is applied at the gate of the drive transistor and the bottom plate of the storage capacitor C0 through transistors T2_1, T3_2 and T3_1. The application of the VREF voltage to the anode of the OLED, the gate of the drive transistor, and the storage capacitor C0 in the various embodiments operates to clear memory effects from the previous frame. The gate and the drain of the drive transistor are also connected to each other through transistor T2_1, T3_2 and T3_3. With the above connection, the drive transistor is diode-connected. Diode-connected refers to the drive transistor T1 being operated with its gate and a second terminal (e.g., source or drain) being electrically connected, such that current flows in one direction. The transistor T2_2 is turned on and ready for the data programming phase.

The TFT circuit 10 next is operable in a threshold compensation phase, during which the threshold voltage of the drive transistor T1 is compensated. For such phase, the EMI(n) signal level is changed from a low voltage value to a high voltage value, causing transistors T4 and T5 to be turned off, and the node N2 between T3_2 and T3_3 becomes floating with N2 still being connected to N1 through transistor T3_2. As the transistor T4 is turned off, the top plate of the storage capacitor, C0, and the source of the drive transistor are disconnected from the power supply, VDD. As the diode-connected drive transistor is connected to VREF, the source voltage of the drive transistor will be pulled down from initial voltage VDD to $V_{REF}+|V_{TH}|$, where $V_{TH}$ is the threshold voltage of the drive transistor.

Preferably, to have effective voltage threshold compensation of the drive transistor T1, the initial voltage difference between the source of the drive transistor and the diode-connected gate-drain of the drive transistor should satisfy the following condition:

$$V_{DD}-V_{REF}>|V_{TH}|+\Delta V,$$

where $\Delta V$ is a voltage that is large enough to generate a high initial current to charge the storage capacitor within an allocated threshold compensation time. The value of $\Delta V$ will depend on the properties of the transistors. For example, $\Delta V$ would be at least 3 volts for exemplary low-temperature polycrystalline silicon thin film transistor processes. The reference voltage, VREF, is set to satisfy this voltage requirement.

At the end of threshold compensation phase, SCAN(n) signal level is changed from the low voltage to the high voltage, causing transistors T3_1, T3_2 and T3_3 to be turned off. As T3_1 is turned off, the anode of the OLED and the pixel circuit generally are disconnected from the reference voltage, VREF. As T3_2 and T3_3 are turned off, node N1 is disconnected from the drain of the drive transistor, and the drive transistor is no longer diode connected. The voltage at the top plate of the storage capacitor C0 is $V_{REF}+|V_{TH}|$. The voltage at the bottom plate of the storage C0 is $V_{REF}$. The threshold voltage $V_{TH}$ is stored at storage capacitor C0, which is between the source and gate of the drive transistor.

The TFT circuit 10 next is operable in a data programming phase. The SCAN(n+8) signal level is changed from the high voltage value to the low voltage value, causing transistor T2_3 to be turned on, which electrically connects the data voltage input VDAT to the storage capacitor C0 over the triple gate data signal pathway. The data signal thus is applied at the bottom plate of the storage capacitor, C0. The data voltage, VDAT, is changed from the value for another pixel (e.g. the previous row of the display DATA (n−1)) to the data value for the current pixel (e.g. the current row of the display DATA(n)), which is applied to the storage capacitor, C0. The voltage change at the bottom plate of the capacitor C0 is $V_{DAT}-V_{REF}$. As the capacitors C0 and C1 are series connected and C1 is connected to a power supply (VDD), the voltage change at node where the top plate of the capacitor C0 and the bottom plate of the capacitor C1 are connected is $$(V_{DAT} - V_{REF})\frac{C_0}{C_0 + C_1}.$$

In this manner, during the programming phase the second or programming capacitor C1 distributes the data voltage between the storage (first) capacitor C0 and the programming (second) capacitor C1. The voltage at this node thus becomes:

$$V_{REF} + |V_{TH}| + (V_{DAT} - V_{REF})\frac{C_0}{C_0 + C_1}$$

For the programming phase, SCAN signals applied to different rows (e.g., SCAN(n+1) and SCAN(n+8)) are employed to electrically connect the data voltage VDAT to the bottom plate of the programming capacitor C1 through the storage capacitor C0. By using SCAN signals from different rows in combination, a short programming pulse results from overlap of the SCAN signals, thereby minimizing the 1H time as shown in the timing diagram of FIG. 2. Although in this embodiment, the SCAN (n+1) and SCAN (n+8) are used to control the switch transistors T2_2 and T2_3 to generate the short programming pulse, the SCAN signals from other rows can be used. This embodiment has an advantage of using existing SCAN signal lines, but requires the two transistors T2_2 and T2_3 to connect VDAT to the programming capacitor C1 during the programming phase.

At the end of the data programming phase, the SCAN(n+ 1) signal level is changed from the low voltage value to the high voltage value, causing transistors T2_1 and T2_2 to be turned off. The gate of the drive transistor and the bottom plate of the capacitor C0 are disconnected from the data voltage, VDAT. VDAT will change to a corresponding value for the next row data programming.

The TFT circuit 10 next is operable in an emission phase during which the OLED is capable of emitting light. The EMI(n) signal is changed from the high voltage value to the low voltage value, causing transistors T5 and T4 to be turned on. As transistor T4 is turned on, the source of the drive transistor and the node, where the bottom plate of the capacitor C1 and the top plate of the capacitor C0 are connected, is connected to the power supply VDD. The voltage change at the top plate of the capacitor C0 is:

$$V_{DD} - \left(V_{REF} + |V_{TH}| + (V_{DAT} - V_{REF})\frac{C_0}{C_0 + C_1}\right)$$

As the bottom plate of the capacitor C0 is floating, the same amount voltage changes at the bottom plate. The voltage at the bottom plate of the capacitor and the gate of the drive transistor then becomes:

$$V_{DAT} + V_{DD} - \left(V_{REF} + |V_{TH}| + (V_{DAT} - V_{REF})\frac{C_0}{C_0 + C_1}\right) =$$
$$V_{DD} - |V_{TH}| + (V_{DAT} - V_{REF})\frac{C_1}{C_0 + C_1}$$

As transistor T5 is turned on, the drain of the drive transistor is connected to anode of the OLED. The current that flows through the OLED is:

$$I_{OLED} = \frac{\beta}{2}\left(V_{DD} - |V_{TH}| + (V_{DAT} - V_{REF})\frac{C_1}{C_0 + C_1} - V_{DD} - V_{TH}\right)^2 =$$
$$\frac{\beta}{2}\left((V_{DAT} - V_{REF})\frac{C_1}{C_0 + C_1}\right)^2$$

where $\beta = \mu_n \cdot C_{ox} \cdot \frac{W}{L}$, $C_{ox}$ is the capacitance of the drive transistor gate oxide;
W is the width of the drive transistor channel;
L is the length of the drive transistor channel (i.e. distance between source and drain); and
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

In accordance with the above, to prevent data line noise from interfering with the voltage at the drive transistor gate during the emission phase, the triple gate configuration of the data signal pathway of the second group transistors is used for enhanced isolation of the data voltage input line from the gate of the drive transistor. To further improve the isolation of the gate of the drive transistor, one of the middle nodes of the triple gate connection between T2_1 and T2_2 farthest from the data voltage input line, N1, is connected to the floating node N2 that is connectable to the reference voltage input line through a portion of the third group transistors during the threshold compensation phase. In this manner, use of the triple gate connection for the data voltage signal and the node where the data voltage and reference voltage pathways connect enhance the reduction of noise, particularly noise from the data voltage input line.

More specifically, the circuit configurations of the present application substantially eliminate noise from the data line as compared to alternative or conventional configurations. Measured noise levels using the circuit configurations of the present application range from about 0.04% for low OLED current conditions to about 0.07% for high OLED current conditions. Such noise levels have negligible effect on the output light emission from the OLED during the emission phase. By contrast, alternative or conventional configurations, which do not use the triple gate connection and/or the VDAT/VREF node connection, experience noise levels ranging from about 2.2% up to as high as about 4.9% for low OLED current conditions, and from about 1.4% up to as high as about 1.7% for high OLED current conditions. Noise levels of the alternative or conventional configurations may have noticeable effects on the output light emission from the OLED during the emission phase.

In addition, as described above the two-capacitor structure is used, whereby the first capacitor C0 is used for the threshold compensation during compensation phase, and the second capacitor C1 is used to scale the data voltage between the two capacitors during programming phase. The threshold compensation and data programming operations thus are independent of each other, and a short one horizontal time can be achieved with a short data programming phase. The scaled data voltage is added to the first capacitor C0, and the sum of the threshold voltage and the scaled data voltage is applied at the gate of the drive transistor for emission during the emission phase. The short one horizontal time improves the responsiveness of the OLED.

Figure 3:
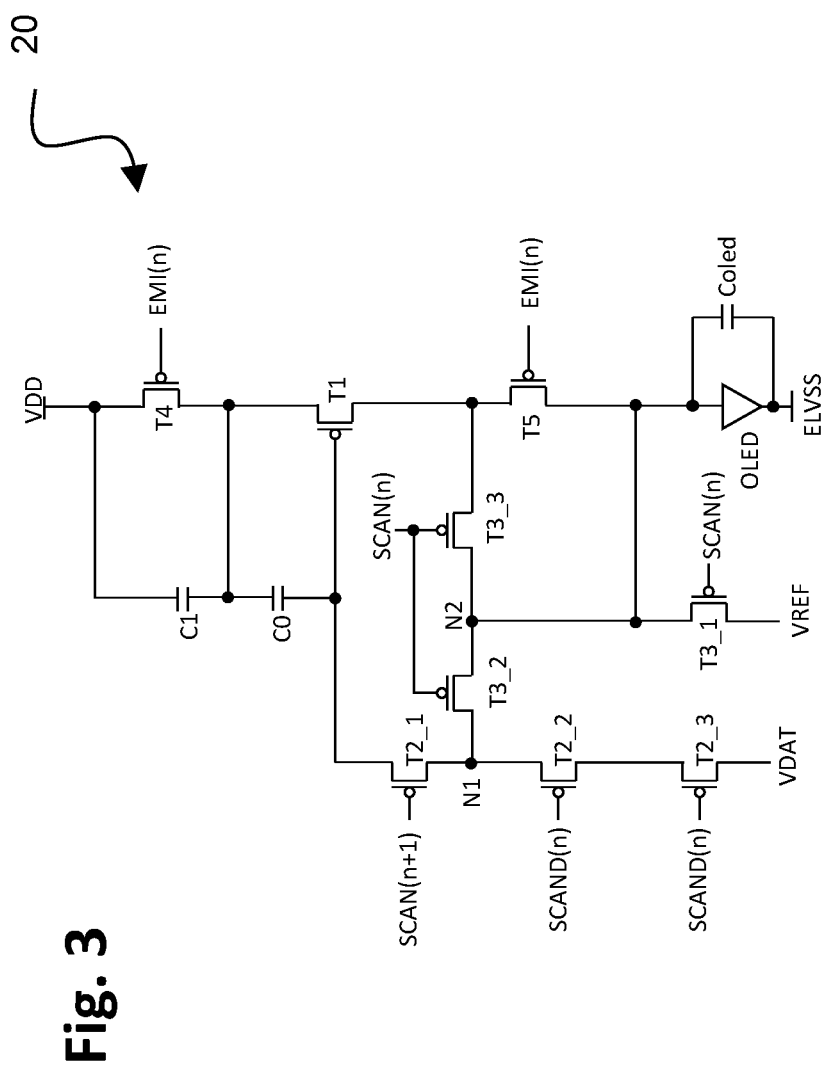
FIG. 3 is a drawing depicting a second circuit configuration in accordance with embodiments of the present invention.
Figure 4:
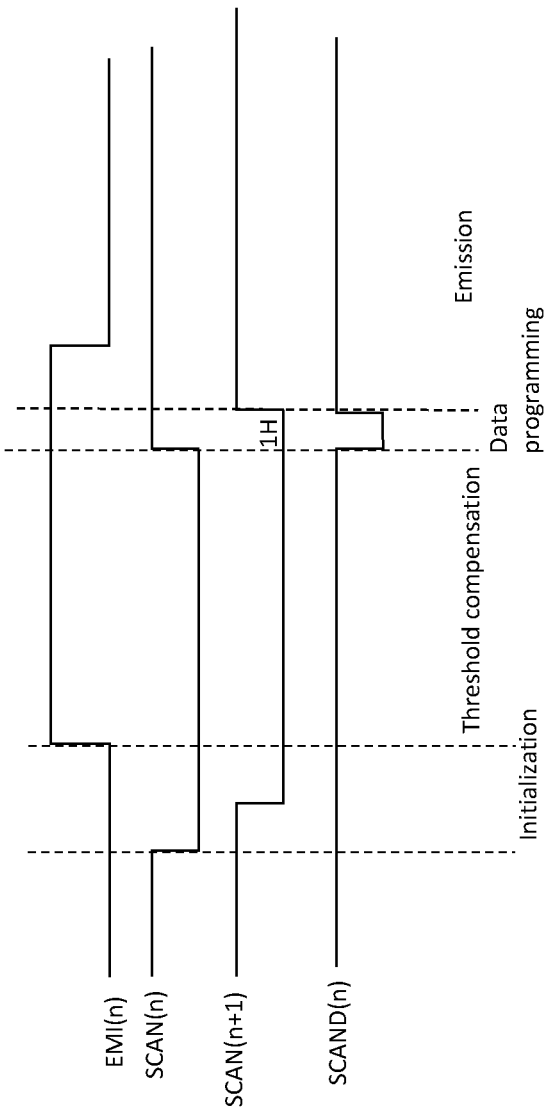
FIG. 4 is a drawing depicting a timing diagram associated with the operation of the circuit of FIG. 3.
Figure 6:
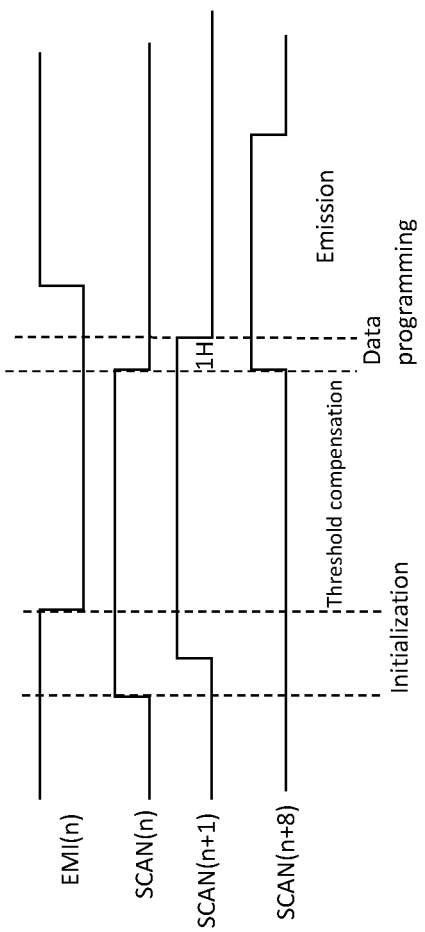
FIG. 6 is a drawing depicting a timing diagram associated with the operation of the circuit of FIG. 5.

FIG. 3 is a drawing depicting a second circuit configuration 20 in accordance with embodiments of the present invention, and FIG. 4 is a timing diagram associated with the operation of the circuit configuration 20 of FIG. 6. In this example, similarly as in the previous embodiment, the circuit 20 is configured as a TFT circuit that includes multiple p-type transistors (T1, T2_1, T2_2, T2_3, T3_1, T3_2, T3_3, T4 and T5). In this embodiment, there again are two capacitors, C0 and C1. The circuit elements drive a light-emitting device, such as for example an OLED. The light-emitting device (OLED) has an associated internal capacitance, which again is represented in the circuit diagram as $C_{oled}$. The OLED further is connected to the power supply ELVSS as is conventional. In addition, although the embodiments are described principally in connection with an OLED as the light-emitting device, comparable principles may be used with display technologies that employ other types of light-emitting devices, including for example micro LEDs and quantum dot LEDs. Similarly as in the previous embodiment, T1 is a drive transistor that is an analogue TFT, and T2_1, T2_2, T2_3, T3_1, T3_2, T3_3, T4 and T5 are digital switch TFTs.

Referring to the TFT circuit 20 in combination with the timing diagram of FIG. 4, the TFT circuit 20 also operates to perform in four phases: an initialization phase, a compensation phase, a data programming phase, and an emission phase for light emission. The configuration of the components and operation of the circuit 20, therefore, is similar as to the operation of the circuit 10 of FIG. 1, except that the circuit 20 employs a dedicated SCAND signal, as further detailed below.

During the previous emission phase, the EMI(n) signal level has a low voltage value, so transistors T4 and T5 are on, and light emission is being driven by the input driving voltage VDD connected to the drive transistor T1, whereby the actual current applied to the OLED is determined by the voltage at the gate of the drive transistor. The various SCAN and the SCAND signal levels initially have a high voltage value so transistors T2_1, T2_2, T2_3, T3_1, T3_2 and T3_3 are off. Next at the beginning of the initialization phase, the SCAN(n) signal level is changed from a high voltage value to a low voltage value, causing transistor T3_1, T3_2 and T3_3 to be turned on. As transistor T3_1 is turned on, the reference voltage, VREF, is applied at the anode of the OLED. The VREF voltage is set to lower than the threshold voltage of the OLED plus ELVSS, and thus the VREF voltage does not cause light emission when applied at anode of the OLED. As transistor T3_2 is turned on, the VREF voltage also is applied to node N1 through transistor T3_1 and T3_2. As transistor T3_3 is turned on, the VREF voltage also is applied to the drain of the drive transistor through T3_1 and T3_3. The drain of the drive transistor is also connected to the VREF through transistors T5 and T31.

Next during the initialization phase, the SCAN(n+1) signal level is changed from a high voltage value to a low voltage value, causing transistor T2_1 to be turned on. As transistor T2_1 is turned on, VREF is applied at the gate of the drive transistor and the bottom plate of the storage capacitor C0 through transistors T2_1, T3_2 and T3_1. As referenced above, the application of the VREF voltage to the anode of the OLED, the gate of the drive transistor, and the storage capacitor C0 in the various embodiments operates to clear memory effects from the previous frame. The gate and the drain of the drive transistor are also connected through transistor T2_1, T3_2 and T3_3, and thus with the above connection the drive transistor is diode-connected.

The TFT circuit 20 next is operable in a threshold compensation phase, during which the threshold voltage of the drive transistor T1 is compensated. For such phase, the EMI(n) signal level is changed from a low voltage value to a high voltage value, causing transistors T4 and T5 to be turned off. As the transistor T4 is turned off, the top plate of the storage capacitor, C0, and the source of the drive transistor are disconnected from the power supply, VDD. As the diode-connected drive transistor is connected to the reference voltage VREF, the source voltage of the drive transistor will be pulled down from initial voltage VDD towards $V_{REF}+|V_{TH}|$, where $V_{TH}$ is the threshold voltage of the drive transistor.

Preferably, to have effective voltage threshold compensation of the drive transistor T1, the initial voltage difference between the source of the drive transistor and the diode-connected gate-drain of the drive transistor should satisfy the following condition:

$$V_{DD}-V_{REF}>|V_{TH}|+\Delta V,$$

where $\Delta V$ is a voltage that is large enough to generate a high initial current to charge the storage capacitor within an allocated threshold compensation time. The value of $\Delta V$ will depend on the properties of the transistors. For example, $\Delta V$ would be at least 3 volts for exemplary low-temperature polycrystalline silicon thin film transistor processes. The reference voltage, VREF, is set to satisfy this voltage requirement.

At the end of threshold compensation phase, SCAN(n) signal level is changed from the low voltage to the high voltage, causing transistors T3_1, T3_2 and T3_3 to be turned off. As T3_1 is turned off, the anode of the OLED and thus the pixel circuit are disconnected from the reference voltage, VREF. As T3_2 and T3_3 are turned off, node N1 is disconnected from the drain of the drive transistor, and the drive transistor is no longer diode connected. The voltage at the top plate of the storage capacitor C0 is $V_{REF}+|V_{TH}|$, and the voltage at the bottom plate of the storage capacitor C0 is $V_{REF}$. The threshold voltage $V_{TH}$ is stored at storage capacitor C0, which is between the source and gate of the drive transistor.

The TFT circuit 20 next is operable in a data programming phase. The SCAND(n) signal level is changed from the high voltage value to the low voltage value, causing transistors T2_2 and T2_3 to be turned on, which electrically connects the data voltage input VDAT to the storage capacitor C0. The data signal thus is applied at the bottom plate of the storage capacitor, C0. The data voltage, VDAT, is changed from the value for another pixel (e.g. the previous row of the display DATA(n−1)) to the data value for the current pixel (e.g. the current row of the display DATA(n)), which is applied to the storage capacitor, C0. The voltage change at the bottom plate of the capacitor C0 is $V_{DAT}-V_{REF}$. As the capacitors C0 and C1 are series connected and C1 is connected to a power supply VDD, the voltage change at node where C0 and C1 are connected, is $$(V_{DAT} - V_{REF}) \frac{C_0}{C_0 + C_1},$$

and thus a scaling of the data voltage by C1 connected to C0 occurs. The voltage at this node becomes:

$$V_{REF} + |V_{TH}| + (V_{DAT} - V_{REF}) \frac{C_0}{C_0 + C_1}$$

The circuit configuration 20 of the embodiment of FIG. 3 differs from the circuit configuration 10 of the embodiment in FIG. 1 with respect to performance of the programming phase. For the programming phase in the circuit configuration 20, as referenced above a dedicated signal line—SCAND(n)—is applied at the gate of the transistors T2_2 and T2_3 to electrically connect the data voltage VDAT to the bottom plate of the capacitor C0. By using a dedicated SCAND signal line, a short pulse is readily achieved to minimize the one horizontal time 1H as shown in the timing diagram of FIG. 4, rather than relying on overlapping SCAN signals from different rows as performed in the previous embodiment. In other words, a shorter 1H time is achieved by using the dedicated signal line SCAND, but this can be weighed against the increased complexity associated with adding another signal line to the circuit configuration.

At the end of the data programming phase, the SCAN(n+1) signal level is changed from the low voltage value to the high voltage value, causing transistor T2_1 to be turned off. The SCAND(n) signal level is changed from the low voltage value to the high voltage value, causing transistors T2_2 and T2_3 to be turned off. The gate of the drive transistor and the bottom plate of the capacitor C0 are disconnected from the data voltage, VDAT, and VDAT will change to a corresponding value for the next row data programming.

The TFT circuit 20 next is operable in an emission phase during which the OLED is capable of emitting light. The EMI(n) signal is changed from the high voltage value to the low voltage value, causing transistors T4 and T5 to be turned on. As transistor T4 is turned on, the source of the drive transistor and the node, where the bottom plate of the capacitor C1 and the top plate of the capacitor C0 are connected, is connected to the power supply VDD. The voltage change at the top plate of the capacitor C0 is:

$$V_{DD} - \left( V_{REF} + |V_{TH}| + (V_{DAT} - V_{REF}) \frac{C_0}{C_0 + C_1} \right)$$

As the bottom plate of the capacitor C0 is floating, the same amount voltage changes at the bottom plate. The voltage at the bottom plate of the capacitor C0 and the gate of the drive transistor then becomes:

$$V_{DAT} + V_{DD} - \left( V_{REF} + |V_{TH}| + (V_{DAT} - V_{REF}) \frac{C_0}{C_0 + C_1} \right) =$$
$$V_{DD} - |V_{TH}| + (V_{DAT} - V_{REF}) \frac{C_1}{C_0 + C_1}$$

As transistor T5 is turned on, the drain of the drive transistor is connected to the anode of the OLED. The current that flows through the OLED is:

$$I_{OLED} = \frac{\beta}{2} \left( V_{DD} - |V_{TH}| + (V_{DAT} - V_{REF}) \frac{C_1}{C_0 + C_1} - V_{DD} - V_{TH} \right)^2 =$$
$$\frac{\beta}{2} \left( (V_{DAT} - V_{REF}) \frac{C_1}{C_0 + C_1} \right)^2$$

where $\beta = \mu_n \cdot C_{ox} \cdot \frac{W}{L}$, $C_{ox}$ is the capacitance of the drive transistor gate oxide;
W is the width of the drive transistor channel;
L is the length of the drive transistor channel (i.e. distance between source and drain); and
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

Similarly as in the previous embodiment, to prevent data line noise from interfering with the voltage at the drive transistor gate during the emission phase, the triple gate configuration of the data signal pathway is used for enhanced isolation of the data voltage line from the gate of the drive transistor. To further improve the isolation of the gate of the drive transistor for reduced noise, one of the middle nodes of the triple gate connection between T2_1 and T2_2 farthest from the data voltage line, N1, is connected to the floating node N2 that is connectable to the reference voltage line during the threshold compensation phase. Enhanced noise reduction is thereby achieved as compared to alternative or conventional configurations. In addition, the two-capacitor structure renders the threshold compensation and data programming operations to be independent of each other, and thus a short one horizontal time can be achieved with a short data programming phase. The short one horizontal time improves the responsiveness of the OLED.

Figure 5:
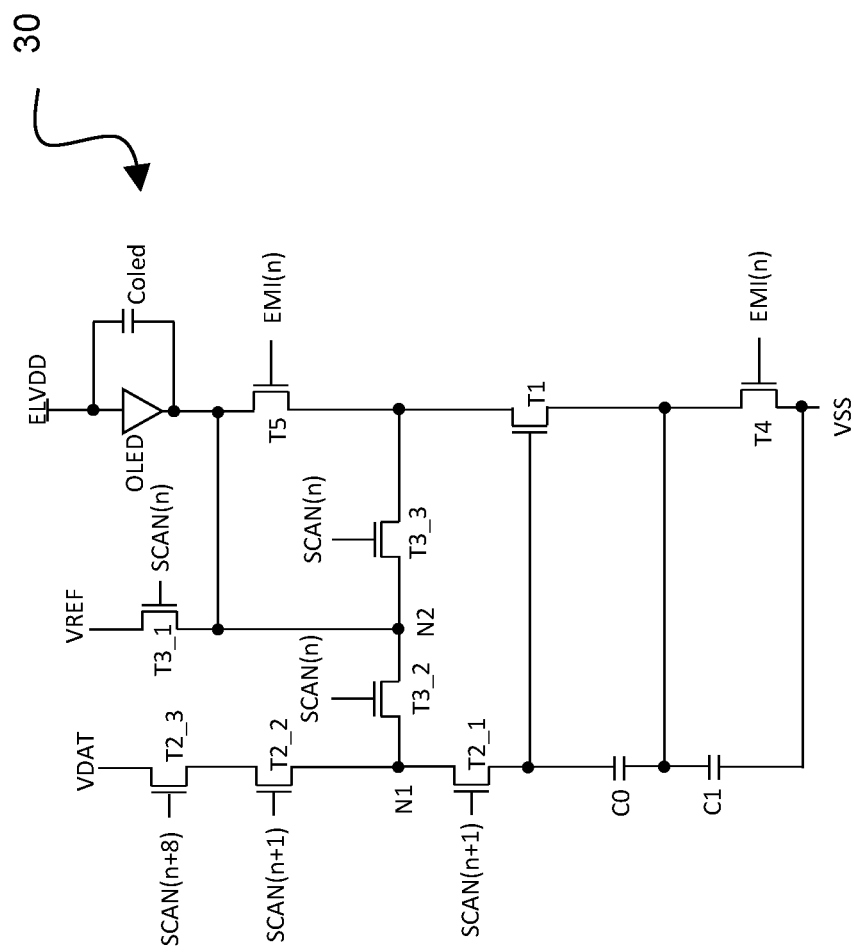
FIG. 5 is a drawing depicting a third circuit configuration in accordance with embodiments of the present invention.

FIG. 5 is a drawing depicting a third circuit configuration 30 in accordance with embodiments of the present invention, and FIG. 6 is a timing diagram associated with the operation of the circuit configuration 30 of FIG. 5. The circuit configuration of FIG. 5 operates comparably as the circuit configuration 10 of FIG. 1, except that the circuit configuration 30 employs n-type transistors rather than p-type transistors. As is known in the art, the drive properties of an OLED may be more suitable for one or other of p-type versus n-type transistors, and the principles of the present invention are applicable to either type of configuration. Accordingly, in this example of FIG. 5, the circuit 30 is configured as a TFT circuit that includes multiple n-type transistors T1, T2_1, T2_2, T2_3, T3_1, T3_2, T3_3, T4 and T5 and two capacitors C0 and C1. The circuit elements drive a light-emitting device, such as for example an OLED. The light-emitting device (OLED) again has an associated internal capacitance, which again is represented in the circuit diagram as $C_{oled}$. The OLED further is connected to a power supply ELVDD as is conventional. In addition, although the embodiments are described principally in connection with an OLED as the light-emitting device, comparable principles may be used with display technologies that employ other types of light-emitting devices, including for example micro LEDs and quantum dot LEDs. Similarly as in the previous embodiments, T1 is a drive transistor that is an analogue TFT, and transistors T2_1, T2_2, T2_3, T3_1, T3_2, T3_3, T4 and T5 are digital switch TFTs.

Referring to the TFT circuit 30 in combination with the timing diagram of FIG. 6, the TFT circuit 30 also operates to perform in four phases: an initialization phase, a compensation phase, a data programming phase and an emission phase for light emission. As referenced above, the circuit configuration of FIG. 5 operates comparably as the circuit configuration 10 of FIG. 1, except that the circuit configuration 30 employs n-type transistors rather than p-type transistors. Accordingly, the principal difference of operation is the relative voltage levels of the input control signals (i.e., high voltage versus low voltage values) being set to operate with n-type transistors.

In this embodiment, during the previous emission phase, the EMI(n) signal level has a high voltage value, so transistors T4 and T5 are on, and light emission is being driven by the input driving voltage VSS connected through the drive transistor T1, whereby the actual current applied to the OLED is determined by the voltage at the gate of the drive transistor. The various SCAN signal levels initially have a low voltage value so transistors T2_1, T2_2, T2_3, T3_1, T3_2 and T3_3 are off. Next at the beginning of the initialization phase, the SCAN(n) signal level is changed from a low voltage value to a high voltage value, causing transistor T3_1, T3_2 and T3_3 to be turned on. As transistor T3_1 is turned on, the reference voltage, VREF, is applied at the cathode of the OLED. The VREF voltage is set to higher than ELVDD minus the threshold voltage of the OLED, and thus the VREF voltage does not cause light emission when applied at the cathode of the OLED. As transistor T3_2 is turned on, the VREF voltage is applied to node N1 through transistor T3_1 and T3_2. As transistor T3_3 is turned on, the VREF voltage is applied to the drain of the drive transistor through T3_1 and T3_3. The drain of the drive transistor is also connected to the VREF through transistors T5 and T3_1.

Next during the initialization phase, the SCAN(n+1) signal level is changed from a low voltage value to a high voltage value, causing transistors T2_1 and T2_2 to be turned on. As transistor T2_1 is turned on, the reference voltage VREF is applied at the gate of the drive transistor and the top plate of the storage capacitor C0 through transistors T2_1, T3_2 and T3_1. The application of the VREF voltage to the cathode of the OLED, the gate of the drive transistor, and the storage capacitor C0 in the various embodiments operates to clear memory effects from the previous frame. The gate and the drain of the drive transistor are also connected through transistor T2_1, T3_2 and T3_3, and thus with the above connection the drive transistor is diode-connected. The transistor T2_2 is turned on and ready for the data programming phase.

The TFT circuit 30 next is operable in a threshold compensation phase, during which the threshold voltage of the drive transistor T1 is compensated. For such phase, the EMI(n) signal level is changed from a high voltage value to a low voltage value, causing transistors T4 and T5 to be turned off. As the transistor T4 is turned off, the bottom plate of the storage capacitor, C0, and the source of the drive transistor are disconnected from the power supply, VSS. As the diode-connected drive transistor is connected to VREF, the source voltage of the drive transistor will be pulled up from the initial voltage VSS to $V_{REF}-V_{TH}$, where $V_{TH}$ is the threshold voltage of the drive transistor.

Preferably, to have effective voltage threshold compensation of the drive transistor T1, the initial voltage difference between the source of the drive transistor and the diode-connected gate-drain of the drive transistor should satisfy the following condition:

$V_{REF}-V_{SS}>V_{TH}+\Delta V,$ where $\Delta V$ is a voltage that is large enough to generate a high initial current to charge the storage capacitor within an allocated threshold compensation time. The value of $\Delta V$ will depend on the properties of the transistors. For example, $\Delta V$ would be at least 3 volts for exemplary low-temperature polycrystalline silicon thin film transistor processes. The reference voltage, VREF, is set to satisfy this voltage requirement.

At the end of threshold compensation phase, SCAN(n) signal level is changed from the high voltage to the low voltage, causing transistors T3_1, T3_2 and T3_3 to be turned off. As T3_1 is turned off, the cathode of the OLED and thus the pixel circuit is disconnected from the reference voltage, VREF. As T3_2 and T3_3 are turned off, the node N1 is disconnected from the drain of the drive transistor, and thus the drive transistor is no longer diode connected. The voltage at the bottom plate of the storage capacitor C0 is $V_{REF}-V_{TH}$, and the voltage at the top plate of the storage C0 is $V_{REF}$. The threshold voltage $V_{TH}$ is stored at storage capacitor C0, which is between the source and gate of the drive transistor.

The TFT circuit 30 next is operable in a data programming phase. The SCAN(n+8) signal level is changed from the low voltage value to the high voltage value, causing transistor T2_3 to be turned on, which electrically connects the data voltage input to the storage capacitor. The data signal thus is applied at the top plate of the storage capacitor, C0. The data voltage, VDAT, is changed from the value for another pixel (e.g. the previous row of the display DATA (n−1)) to the data value for the current pixel (e.g. the current row of the display DATA(n)), which is applied to the storage capacitor, C0. The voltage change at the top plate of the capacitor C0 is $V_{DAT}-V_{REF}$. As the capacitors C0 and C1 are series connected, the voltage change at node where C0 and C1 are connected is $$(V_{DAT}-V_{REF})\frac{C_0}{C_0+C_1},$$

and thus a scaling of the data voltage by C1 connected to C0 occurs. The voltage at this node becomes:

$$V_{REF}-V_{TH}+(V_{DAT}-V_{REF})\frac{C_0}{C_0+C_1}$$

At the end of the data programming phase, the SCAN(n+1) signal level is changed from the high voltage value to the low voltage value, causing transistors T2_1 and T2_2 to be turned off. The gate of the drive transistor and the top plate of the capacitor C0 are disconnected from the data voltage, VDAT. VDAT will change to a corresponding value for the next row data programming.

The TFT circuit 30 next is operable in an emission phase during which the OLED is capable of emitting light. The EMI(n) signal is changed from the low voltage value to the high voltage value, causing transistors T4 and T5 to be turned on. As transistor T4 is turned on, the source of the drive transistor and the node, where the top plate of the capacitor C1 and the bottom plate of the capacitor C0 are connected, is connected to the power supply VSS. The voltage change at the bottom plate of the capacitor C0 is:

$$V_{SS} - \left(V_{REF} - V_{TH} + (V_{DAT} - V_{REF})\frac{C_0}{C_0 + C_1}\right)$$

As the top plate of the capacitor C0 is floating, the same amount voltage changes at the top plate. The voltage at the top plate of the capacitor and the gate of the drive transistor then becomes:

$$V_{DAT} + V_{SS} - \left(V_{REF} - V_{TH} + (V_{DAT} - V_{REF})\frac{C_0}{C_0 + C_1}\right) =$$

$$V_{SS} + V_{TH} + (V_{DAT} - V_{REF})\frac{C_1}{C_0 + C_1}$$

As transistor T5 is turned on, the drain of the drive transistor is connected to the cathode of the OLED. The current that flows through the OLED is:

$$I_{OLED} = \frac{\beta}{2}\left(V_{SS} + V_{TH} + (V_{DAT} - V_{REF})\frac{C_1}{C_0 + C_1} - V_{SS} - V_{TH}\right)^2 =$$

$$\frac{\beta}{2}\left((V_{DAT} - V_{REF})\frac{C_1}{C_0 + C_1}\right)^2$$

where $\beta = \mu_n \cdot C_{ox} \cdot \frac{W}{L}$, $C_{ox}$ is the capacitance of the drive transistor gate oxide;
W is the width of the drive transistor channel;
L is the length of the drive transistor channel (i.e. distance between source and drain); and
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

Similarly as in the previous embodiments, to prevent data line noise from interfering with the voltage at the drive transistor gate during the emission phase, the triple gate configuration of the data signal pathway is used for enhanced isolation of the data voltage input line from the gate of the drive transistor. To further improve the isolation of the gate of the drive transistor for reduced noise, one of the middle nodes of the triple gate connection between T2_1 and T2_2 farthest from the data voltage line, N1, is connected to the floating node N2 that is connectable to the reference voltage input line during the threshold compensation phase. Enhanced noise reduction is thereby achieved as compared to alternative or conventional configurations. In addition, the two-capacitor structure renders the threshold compensation and data programming operations to be independent of each other, and thus a short one horizontal time can be achieved with a short data programming phase. The short one horizontal time improves the responsiveness of the OLED.

Figure 7:
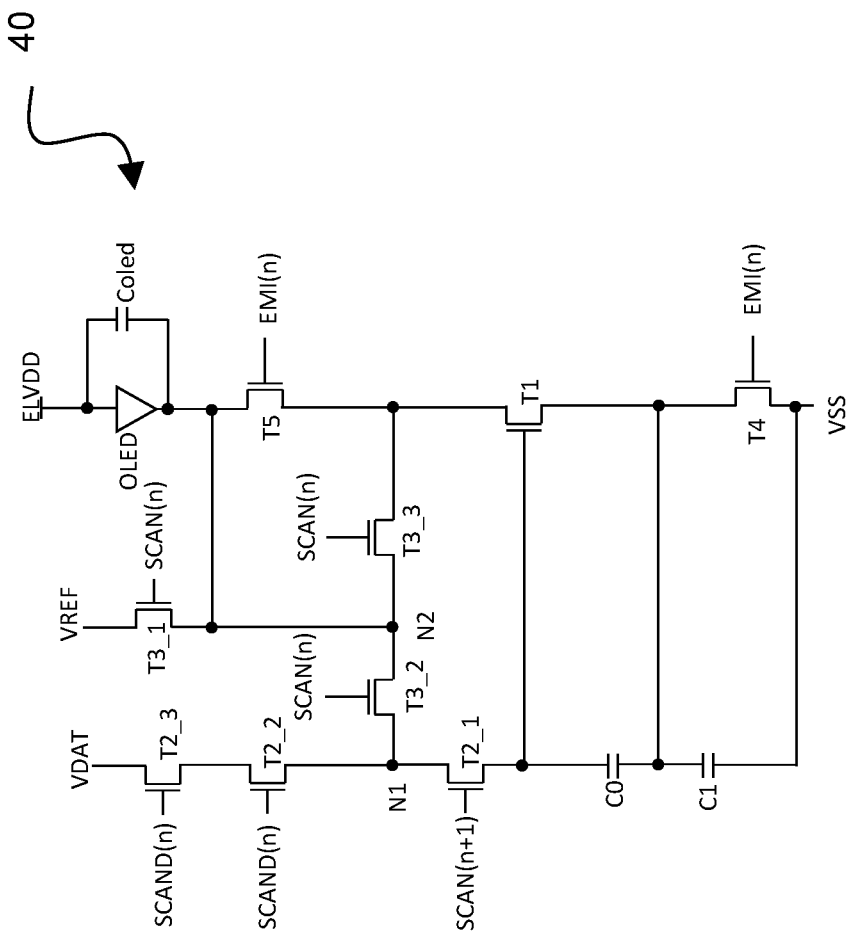
FIG. 7 is a drawing depicting a fourth circuit configuration in accordance with embodiments of the present invention.

FIG. 7 is a drawing depicting a fourth circuit configuration 40 in accordance with embodiments of the present invention, and FIG. 8 is a timing diagram associated with the operation of the circuit configuration 40 of FIG. 7. The circuit configuration 40 of FIG. 7 operates comparably as the circuit configuration 20 of FIG. 3, except that the circuit configuration 40 employs n-type transistors rather than p-type transistors. As referenced above, as is known in the art, the drive properties of an OLED may be more suitable for one or other of p-type versus n-type transistors, and the principles of the present invention are applicable to either type of configuration. Accordingly, in this example, the circuit 40 is configured as a TFT circuit that includes multiple n-type transistors (T1, T2_1, T2_2, T2_3, T3_1, T3_2, T3_3, T4 and T5) and two storage capacitors C0 and C1. The circuit elements drive a light-emitting device, such as for example an OLED. The light-emitting device (OLED) has an associated internal capacitance, which again is represented in the circuit diagram as $C_{oled}$. The OLED further is connected to the power supply ELVDD as is conventional. In addition, although the embodiments are described principally in connection with an OLED as the light-emitting device, comparable principles may be used with display technologies that employ other types of light-emitting devices, including for example micro LEDs and quantum dot LEDs. Similarly as in the previous embodiment, T1 is a drive transistor that is an analogue TFT, and T2_1, T2_2, T2_3, T3_1, T3_2, T3_4, T4 and T5 are digital switch TFTs.

Referring to the TFT circuit 40 in combination with the timing diagram of FIG. 8, the TFT circuit 40 also operates to perform in four phases: an initialization phase, a compensation phase, a data programming phase, and an emission phase for light emission. As referenced above, the circuit configuration of FIG. 7 operates comparably as the circuit configuration 20 of FIG. 3, except that the circuit configuration 40 employs n-type transistors rather than p-type transistors. Accordingly, the principal difference of operation is the relative voltage levels of the input control signals (i.e., high voltage versus low voltage values) being set to operate with n-type transistors. In addition, the configuration of the components and operation of the circuit 40 is similar as to the operation of the circuit 30 of FIG. 5, except that the circuit 40 employs a dedicated SCAND signal, as further detailed below.

During the previous emission phase, the EMI(n) signal level has a high voltage value, so transistors T4 and T5 are on, and light emission is being driven by the input driving voltage VSS connected through to the drive transistor T1, whereby the actual current applied to the OLED is determined by the voltage at the gate of the drive transistor. The various SCAN and SCAND signal levels initially have a low voltage value so transistors T2_1, T2_2, T2_3, T3_1, T3_2 and T3_3 are off. Next at the beginning of the initialization phase, the SCAN(n) signal level is changed from a low voltage value to a high voltage value, causing transistors T3_1, T3_2 and T3_3 to be turned on. As transistor T3_1 is turned on, the reference voltage, VREF, is applied at the cathode of the OLED. The VREF voltage is set to higher than ELVDD minus the threshold voltage of the OLED, and thus the VREF voltage does not cause light emission when applied at the cathode of the OLED. As transistor T3_2 is turned on, the VREF voltage is applied to node N1 through transistors T3_1 and T3_2. As transistor T3_3 is turned on, the VREF voltage is applied to the drain of the drive transistor through transistors T3_1 and T3_3. The drain of the drive transistor is also connected to VREF through transistors T5 and T3_1.

Next during the initialization phase, the SCAN(n+1) signal level is changed from a low voltage value to a high voltage value, causing transistor T2_1 to be turned on. As transistor T2_1 is turned on, the reference voltage VREF is applied at the gate of the drive transistor and the top plate of the storage capacitor C0 through transistor T2_1, T3_2 and T3_1. As referenced above, the application of the VREF voltage to the cathode of the OLED, the gate of the drive transistor, and the storage capacitor C0 in the various embodiments operates to clear memory effects from the previous frame. The gate and the drain of the drive transistor are also connected through transistors T2_1, T3_2 and T3_3, and thus with the above connection the drive transistor is diode-connected.

The TFT circuit 40 next is operable in a threshold compensation phase, during which the threshold voltage of the drive transistor T1 is compensated. For such phase, the EMI(n) signal level is changed from a high voltage value to a low voltage value, causing transistors T4 and T5 to be turned off. As the transistor T4 is turned off, the bottom plate of the storage capacitor, $C_0$, and the source of the drive transistor are disconnected from the power supply, VSS. As the diode-connected drive transistor is connected to VREF, the source voltage of the drive transistor will be pulled up from initial voltage VSS to $V_{REF}-V_{TH}$, where $V_{TH}$ is the threshold voltage of the drive transistor.

Preferably, to have effective voltage threshold compensation of the drive transistor T1, the initial voltage difference between the source of the drive transistor and the diode-connected gate-drain of the drive transistor should satisfy the following condition:

$$V_{REF}-V_{SS}>V_{TH}+\Delta V,$$

where ΔV is a voltage that is large enough to generate a high initial current to charge the storage capacitor within an allocated threshold compensation time. The value of ΔV will depend on the properties of the transistors. For example, ΔV would be at least 3 volts for exemplary low-temperature polycrystalline silicon thin film transistor processes. The reference voltage, VREF, is set to satisfy this voltage requirement.

At the end of threshold compensation phase, the SCAN(n) signal level is changed from the high voltage to the low voltage, causing transistors T3_1, T3_2 and T3_3 to be turned off. As T3_1 is turned off, the cathode of the OLED and thus the pixel circuit are disconnected from the reference voltage, VREF. As T3_2 and T3_3 are turned off, node N1 is disconnected from the drain of the drive transistor, and the drive transistor is no longer diode-connected. The voltage at the bottom plate of the storage capacitor C0 is $V_{REF}-V_{TH}$, and the voltage at the top plate of the storage capacitor C0 is $V_{REF}$. The threshold voltage $V_{TH}$ is stored at storage capacitor C0, which is between the source and gate of the drive transistor.

The TFT circuit 40 next is operable in a data programming phase. The SCAND(n) signal level is changed from the low voltage value to the high voltage value, causing transistor T2_2 and T2_3 to be turned on, which electrically connects the data voltage input VDAT to the storage capacitor C0. The data signal thus is applied at the top plate of the storage capacitor, C0. The data voltage, VDAT, is changed from the value for another pixel (e.g. the previous row of the display DATA(n−1)) to the data value for the current pixel (e.g. the current row of the display DATA(n)), which is applied to the storage capacitor, C0. The voltage change at the top plate of the capacitor $C_0$ is $V_{DAT}-V_{REF}$. As the capacitor C0 and C1 are series connected and C1 is connected to a power supply VSS, the voltage change at node where C0 and C1 are connected, is $$(V_{DAT}-V_{REF})\frac{C_0}{C_0+C_1},$$

and thus a scaling of the data voltage by C1 connected to C0 occurs. The voltage at this node becomes:

$$V_{REF}-V_{TH}+(V_{DAT}-V_{REF})\frac{C_0}{C_0+C_1}$$

The circuit configuration 40 of the embodiment of FIG. 7 differs from the circuit configuration 30 of the embodiment in FIG. 5 with respect to performance of the programming phase. For the programming phase in the circuit configuration 40, a dedicated signal line—SCAND(n)—is applied at the gate of the transistors T2_2 and T2_3 to electrically connect the data voltage VDAT to the top plate of the capacitor C0. By using a dedicated SCAND signal line, a short pulse is readily achieved to minimize the one horizontal time 1H as shown in the timing diagram of FIG. 8, rather than relying on overlapping SCAN signals from different rows in combination as performed in the previous embodiment. In other words, a shorter 1H time is achieved by using the dedicated signal line SCAND, but this can be weighed against the increased complexity associated with adding another signal line to the circuit configuration.

At the end of the data programming phase, the SCAN(n+1) signal level is changed from the high voltage value to the low voltage value, causing transistor T2_1 to be turned off. The SCAND(n) signal level is changed from the high voltage value to the low voltage value, causing transistor T2_2 and T2_3 to be turned off. The gate of the drive transistor and the top plate of the capacitor C0 are disconnected from the data voltage, VDAT. VDAT will change to a corresponding value for the next row data programming.

The TFT circuit 40 next is operable in an emission phase during which the OLED is capable of emitting light. The EMI(n) signal is changed from the low voltage value to the high voltage value, causing transistors T4 and T5 to be turned on. As transistor T4 is turned on, the source of the drive transistor and the node, where the top plate of the capacitor C1 and the bottom plate of the capacitor C0 are connected, is connected to the power supply VSS. The voltage change at the bottom plate of the capacitor C0 is:

$$V_{SS}-\left(V_{REF}-V_{TH}+(V_{DAT}-V_{REF})\frac{C_0}{C_0+C_1}\right)$$

As the top plate of the capacitor C0 is floating, the same amount voltage changes at the top plate. The voltage at the top plate of the capacitor and the gate of the drive transistor then becomes:

$$V_{DAT}+V_{SS}-\left(V_{REF}-V_{TH}+(V_{DAT}-V_{REF})\frac{C_0}{C_0+C_1}\right)=$$
$$V_{SS}-V_{TH}+(V_{DAT}-V_{REF})\frac{C_1}{C_0+C_1}$$

As transistor T5 is turned on, the drain of the drive transistor is connected to the cathode of the OLED. The current that flows through the OLED is:

$$I_{OLED}=\frac{\beta}{2}\left(V_{SS}-V_{TH}+(V_{DAT}-V_{REF})\frac{C_1}{C_0+C_1}-V_{SS}-V_{TH}\right)^2=$$

-continued $$\frac{\beta}{2}\left((V_{DAT} - V_{REF})\frac{C_1}{C_0 + C_1}\right)^2$$

where $\beta = \mu_n \cdot C_{ox} \cdot \frac{W}{L}$, $C_{ox}$ is the capacitance of the drive transistor gate oxide;
W is the width of the drive transistor channel;
L is the length of the drive transistor channel (i.e. distance between source and drain); and
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

Similarly as in the previous embodiments, to prevent data line noise from interfering with the voltage at the drive transistor gate during the emission phase, the triple gate configuration of the data signal pathway is used for enhanced isolation of the data voltage input line from the gate of the drive transistor. To further improve the isolation of the gate of the drive transistor for reduced noise, one of the middle nodes of the triple gate connection between T2_1 and T2_2 farthest from the data voltage input line, N1, is connected to the floating node N2 that is connectable to the reference voltage input line during the threshold compensation phase. Enhanced noise reduction is thereby achieved as compared to alternative or conventional configurations. In addition, the two-capacitor structure renders the threshold compensation and data programming operations to be independent of each other, and thus a short one horizontal time can be achieved with a short data programming phase. The short one horizontal time improves the responsiveness of the OLED.

An aspect of the invention, therefore, is a pixel circuit for a display device operable in a compensation phase, a programming phase, and an emission phase, whereby the one horizontal time is minimized while maintaining accurate compensation of the threshold voltage of the drive transistor, and noise applied to the gate of drive transistor during the emission phase is substantially eliminated. In exemplary embodiments, the pixel circuit includes a drive transistor configured to control an amount of current to a light-emitting device during the emission phase depending upon a voltage applied to a gate of the drive transistor; a first capacitor having a first plate connected to the gate of the drive transistor and a second plate connected to a first terminal of the drive transistor, wherein the second plate also is connected to a first power supply during the emission phase; a light-emitting device that is connected at a first terminal to a second terminal of the drive transistor during the emission phase and at a second terminal to a second power supply; second group transistors connected between the gate of the drive transistor and a data voltage input line, wherein the second group transistors comprises three transistors to provide a triple gate connection between the data voltage input line and the gate of the drive transistor; and third group transistors connected between a reference voltage input line and a node located between adjacent transistors of the second group transistors. The pixel circuit may include one or more of the following features, either individually or in combination.

In an exemplary embodiment of the pixel circuit, the second group transistors comprises a first transistor that is connected between the gate of the drive transistor and a node N1; a second transistor that is connected between the node N1 and a first terminal of a third transistor; and a second terminal of the third transistor connected to the data voltage input line.

In an exemplary embodiment of the pixel circuit, a portion of the third group transistors is connected between the reference voltage input line and the node N1.

In an exemplary embodiment of the pixel circuit, the third group transistors comprises a fourth transistor that is connected between the reference voltage input line and a node N2, and a fifth transistor that is connected between the node N1 and the node N2.

In an exemplary embodiment of the pixel circuit, the third group transistors further comprises a sixth transistor that is connected between the second terminal of the drive transistor and the node N2, and the drive transistor is diode-connected and connected to the reference voltage input during the compensation phase.

In an exemplary embodiment of the pixel circuit, the first terminal of the light-emitting device is connected to the node N2, and the pixel circuit further is operable in an initialization phase during which the reference voltage is applied to the first terminal of the light emitting device and to the gate of the drive transistor.

In an exemplary embodiment of the pixel circuit, the pixel circuit further includes a seventh transistor and a second capacitor that are connected between the first power supply and the first terminal of the drive transistor; wherein during the emission phase the first power supply is connected to the drive transistor through the seventh transistor, and during the programming phase the second capacitor distributes the data voltage between the first and second capacitors.

In an exemplary embodiment of the pixel circuit, the pixel circuit further includes an eighth transistor that is connected between the second terminal of the drive transistor and the first terminal of the light-emitting device; wherein the light-emitting device is electrically connected to the drive transistor through the eighth transistor during the emission phase and electrically isolated from the drive transistor during the compensation and data programming phases.

In an exemplary embodiment of the pixel circuit, the light-emitting device is one of an organic light-emitting diode, a micro light-emitting diode (LED), or a quantum dot LED.

In an exemplary embodiment of the pixel circuit, the transistors are p-type transistors.

In an exemplary embodiment of the pixel circuit, the transistors are n-type transistors.

Another aspect of the invention is a method of operating a pixel circuit according to any of the embodiments, whereby the one horizontal time is minimized while maintaining accurate compensation of the threshold voltage of the drive transistor, and noise applied to the gate of drive transistor during the emission phase is substantially eliminated. In exemplary embodiments, the method of operating includes the steps of providing a pixel circuit according to any of the embodiments; performing a compensation phase to compensate a threshold voltage of the drive transistor comprising: diode connecting the drive transistor by connecting a gate and a second terminal of the drive transistor through a portion of the second and third group transistors; disconnecting the first terminal of the drive transistor from the first power supply; and applying a reference voltage from the reference voltage input line to the gate of the diode-connected drive transistor through a portion of the second and third group transistors; performing a data programming phase to program a data voltage from the data voltage input line at the first capacitor, comprising applying the data voltage through the second group transistors to the first plate of the first capacitor and to the gate of the drive transistor; and performing an emission phase during which light is emitted from the light-emitting device comprising: applying the first power supply to the second terminal of the storage capacitor and to the first terminal of the drive transistor; and applying the second power supply to the second terminal of the light-emitting device. The method of operating may include one or more of the following features, either individually or in combination.

In an exemplary embodiment of the method of operating, the second group transistors comprises a first transistor that is connected between the gate of the drive transistor and a node N1; a second transistor that is connected between the node N1 and a first terminal of a third transistor; and a second terminal of the third transistor connected to the data voltage input line.

In an exemplary embodiment of the method of operating, the third group transistors comprises a fourth transistor that is connected between the reference voltage input line and a node N2, and a fifth transistor that is connected between the node N1 and the node N2; and during the compensation phase the reference voltage is applied to the gate of the drive transistor through the fourth, fifth, and third transistors.

In an exemplary embodiment of the method of operating, the third group transistors further comprises a sixth transistor that is connected between the second terminal of the drive transistor and the node N2; the drive transistor is diode-connected through the third, fifth, and sixth transistors during the compensation phase; and the second terminal of the drive transistor is connected to the reference voltage through the fourth and sixth transistors during the compensation phase.

In an exemplary embodiment of the method of operating, the method further includes performing an initialization phase to initialize the gate voltage of the drive transistor and the voltage across the light-emitting device, the initialization phase comprising: applying the reference voltage to the first plate of the first capacitor and the gate of the drive transistor by connecting the gate of the drive transistor to the reference voltage input line through a portion of the second group and third group transistors; and applying the reference voltage to the first terminal of the light-emitting device through one of the third group transistors.

In an exemplary embodiment of the method of operating, the pixel circuit further comprises a second capacitor that is connected between the first power supply, and the first terminal of the drive transistor and second plate of the first capacitor; wherein during the programming phase the second capacitor distributes the data voltage between the first and second capacitors.

In an exemplary embodiment of the method of operating, the pixel circuit further comprises a seventh transistor that is connected between the first power supply and the first terminal of the drive transistor, wherein during the emission phase the first power supply is electrically connected to the drive transistor through the seventh transistor.

In an exemplary embodiment of the method of operating, the pixel circuit further comprises an eighth transistor that is connected between the second terminal of the drive transistor and the first terminal of the light-emitting device; wherein the light-emitting device is electrically connected to the drive transistor through the eighth transistor during the emission phase and is electrically isolated from the drive transistor during the compensation and data programming phases.

In an exemplary embodiment of the method of operating, during the emission phase, the second and third group transistors are placed in an off state, thereby reducing noise applied to the gate of the drive transistor.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention are applicable to many display devices to permit display devices of high resolution with effective threshold voltage compensation and true black performance. Examples of such devices include televisions, mobile phones, personal digital assistants (PDAs), tablet and laptop computers, desktop monitors, digital cameras, and like devices for which a high resolution display is desirable.

REFERENCE SIGNS LIST

10—first circuit configuration
20—second circuit configuration
30—third circuit configuration
40—fourth circuit configuration
T1-T5 (T2_1, T2_2, T2_3, T3_1, T3_2, T3_3)—multiple transistors
OLED—organic light emitting diode (or generally light-emitting device)
C0—storage capacitor
C1—programming capacitor
$C_{oled}$—internal capacitance of OLED
N1—Node in the pixel circuits
N2—Node in the pixel circuits
VDAT—data voltage
VDD—power supply
VSS—power supply
ELVSS—power supply
ELVDD—power supply
VREF—reference voltage supply
SCAN/SCAND/EMI—control signals

What is claimed is:

1. A pixel circuit for a display device operable in a compensation phase, a data programming phase, and an emission phase, the pixel circuit comprising:

a drive transistor configured to control an amount of current to a light-emitting device during the emission phase depending upon a voltage applied to a gate of the drive transistor;

a first capacitor having a first plate connected to the gate of the drive transistor and a second plate connected to a first terminal of the drive transistor, wherein the second plate also is connected to a first power supply during the emission phase;

a light-emitting device that is connected at a first terminal to a second terminal of the drive transistor during the emission phase and at a second terminal to a second power supply;

second group transistors connected between the gate of the drive transistor and a data voltage input line, wherein the second group transistors comprises three transistors to provide a triple gate connection between the data voltage input line and the gate of the drive transistor; and third group transistors connected between a reference voltage input line and a node located between adjacent transistors of the second group transistors.

2. The pixel circuit of claim 1, wherein the second group transistors comprises a first transistor that is connected between the gate of the drive transistor and a node N1; a second transistor that is connected between the node N1 and a first terminal of a third transistor; and a second terminal of the third transistor connected to the data voltage input line.

3. The pixel circuit of claim 2, wherein a portion of the third group transistors is connected between the reference voltage input line and the node N1.

4. The pixel circuit of claim 3, wherein the third group transistors comprises a fourth transistor that is connected between the reference voltage input line and a node N2, and a fifth transistor that is connected between the node N1 and the node N2.

5. The pixel circuit of claim 4, wherein the third group transistors further comprises a sixth transistor that is connected between the second terminal of the drive transistor and the node N2, and the drive transistor is diode-connected and connected to the reference voltage input during the compensation phase.

6. The pixel circuit of claim 4, wherein the first terminal of the light-emitting device is connected to the node N2, and the pixel circuit further is operable in an initialization phase during which the reference voltage is applied to the first terminal of the light emitting device and to the gate of the drive transistor.

7. The pixel circuit of claim 1, further comprising a seventh transistor and a second capacitor that are connected between the first power supply and the first terminal of the drive transistor;

wherein during the emission phase the first power supply is connected to the drive transistor through the seventh transistor, and during the programming phase the second capacitor distributes the data voltage between the first and second capacitors.

8. The pixel circuit of claim 1, further comprising an eighth transistor that is connected between the second terminal of the drive transistor and the first terminal of the light-emitting device;

wherein the light-emitting device is electrically connected to the drive transistor through the eighth transistor during the emission phase and electrically isolated from the drive transistor during the compensation and data programming phases.

9. The pixel circuit of claim 1, wherein the light-emitting device is one of an organic light-emitting diode, a micro light-emitting diode (LED), or a quantum dot LED.

10. The pixel circuit of claim 1, wherein the transistors are p-type transistors.

11. The pixel circuit of claim 1, wherein the transistors are n-type transistors.

12. A method of operating a pixel circuit for a display device comprising the steps of:

providing a pixel circuit comprising:

a drive transistor configured to control an amount of current to a light-emitting device during the emission phase depending upon a voltage applied to a gate of the drive transistor;

a first capacitor having a first plate connected to the gate of the drive transistor and a second plate connected to a first terminal of the drive transistor, wherein the second plate also is connected to a first power supply during the emission phase;

a light-emitting device that is connected at a first terminal to a second terminal of the drive transistor during the emission phase and at a second terminal to a second power supply;

second group transistors connected between the gate of the drive transistor and a data voltage input line, wherein the second group transistors comprises three transistors to provide a triple gate connection between the data voltage input line and the gate of the drive transistor; and third group transistors connected between a reference voltage input line and a node located between adjacent transistors of the second group transistors;

performing a compensation phase to compensate a threshold voltage of the drive transistor comprising: diode connecting the drive transistor by connecting the gate and the second terminal of the drive transistor through a portion of the second and third group transistors; disconnecting the first terminal of the drive transistor from the first power supply; and applying a reference voltage from the reference voltage input line to the gate of the diode-connected drive transistor through a portion of the second and third group transistors;

performing a data programming phase to program a data voltage from the data voltage input line at the first capacitor, comprising applying the data voltage through the second group transistors to the first plate of the first capacitor and to the gate of the drive transistor; and performing an emission phase during which light is emitted from the light-emitting device comprising: applying the first power supply to the second terminal of the storage capacitor and to the first terminal of the drive transistor; and applying the second power supply to the second terminal of the light-emitting device.

13. The method of operating of claim 12, wherein the second group transistors comprises a first transistor that is connected between the gate of the drive transistor and a node N1; a second transistor that is connected between the node N1 and a first terminal of a third transistor; and a second terminal of the third transistor connected to the data voltage input line.

14. The method of operating of claim 13, wherein:

the third group transistors comprises a fourth transistor that is connected between the reference voltage input line and a node N2, and a fifth transistor that is connected between the node N1 and the node N2; and during the compensation phase the reference voltage is applied to the gate of the drive transistor through the fourth, fifth, and third transistors.

15. The method of operating of claim 14, wherein:

the third group transistors further comprises a sixth transistor that is connected between the second terminal of the drive transistor and the node N2;

the drive transistor is diode-connected through the third, fifth, and sixth transistors during the compensation phase; and the second terminal of the drive transistor is connected to the reference voltage through the fourth and sixth transistors during the compensation phase.

16. The method of operating of claim 12, further comprising performing an initialization phase to initialize the gate voltage of the drive transistor and the voltage across the light-emitting device, the initialization phase comprising:

applying the reference voltage to the first plate of the first capacitor and the gate of the drive transistor by connecting the gate of the drive transistor to the reference voltage input line through a portion of the second group and third group transistors; and applying the reference voltage to the first terminal of the light-emitting device through one of the third group transistors.

17. The method of operating of claim 12, wherein the pixel circuit further comprises a second capacitor that is connected between the first power supply, and the first terminal of the drive transistor and second plate of the first capacitor; and wherein during the programming phase the second capacitor distributes the data voltage between the first and second capacitors.

18. The method of operating of claim 12, wherein the pixel circuit further comprises a seventh transistor that is connected between the first power supply and the first terminal of the drive transistor, and during the emission phase the first power supply is electrically connected to the drive transistor through the seventh transistor.

19. The method of operating of claim 12, wherein the pixel circuit further comprises an eighth transistor that is connected between the second terminal of the drive transistor and the first terminal of the light-emitting device; and wherein the light-emitting device is electrically connected to the drive transistor through the eighth transistor during the emission phase and is electrically isolated from the drive transistor during the compensation and data programming phases.

20. The method of operating of claim 12, wherein during the emission phase, the second and third group transistors are placed in an off state, thereby reducing noise applied to the gate of the drive transistor.

* * * * *